United States Patent

Ohashi et al.

[11] Patent Number: 5,902,687
[45] Date of Patent: May 11, 1999

[54] LAMINATED SINGLE CRYSTALLINE MATERIALS

[75] Inventors: Osamu Ohashi; Hiroshi Harada; Susumu Meguro, all of Ibaraki, Japan

[73] Assignee: National Research Institute for Metals, Japan

[21] Appl. No.: 08/681,400

[22] Filed: Jul. 23, 1996

[30] Foreign Application Priority Data

Aug. 14, 1995 [JP] Japan .................................. 206915/95

[51] Int. Cl.[6] .............................. B32B 1/08; B32B 15/00
[52] U.S. Cl. ........................................... 428/636; 428/663
[58] Field of Search ..................... 428/636, 660, 428/663, 664, 637, 638

[56] References Cited

U.S. PATENT DOCUMENTS

| | | | |
|---|---|---|---|
| 3,530,568 | 9/1970 | Owczarski et al. | 29/498 |
| 3,678,570 | 7/1972 | Paulonis et al. | 29/498 |
| 3,826,700 | 7/1974 | Chu | 148/177 |
| 3,967,355 | 7/1976 | Giamei et al. | 29/194 |
| 4,499,155 | 2/1985 | Holiday | 428/586 |
| 5,201,977 | 4/1993 | Aoshima | 156/153 |

*Primary Examiner*—John J. Zimmerman
*Attorney, Agent, or Firm*—Wenderoth, Lind & Ponack, L.L.P.

[57] ABSTRACT

A laminated material consists of more than three single crystalline layers of a metal or alloy. The layers are joined with one another by diffusion under effects of pressurization and heating in a deoxidative atmosphere. The layers are also conformed within an angular range where crystalline orientations of composition planes of the layers can be directly joined.

3 Claims, 3 Drawing Sheets

LAMINATED SINGLE CRYSTALLINE MATERIALS

FIELD OF THE INVENTION

This invention relates to laminated single crystalline materials. More particularly, this invention relates to laminated materials in which single crystalline metals or alloys are laminated and joined by diffusion in a deoxidative atmosphere.

DESCRIPTION OF THE PRIOR ART

It is well-known that various physical properties of metals and alloys such as mechanical strength and anti-corrosion are greatly influenced to by grain boundaries of these materials. Segregation of impurities and solute atoms in the grain boundaries deteriorates bonding power of the grain boundaries and promotes intergranular fracture, resulting in embrittlement of the materials. The degree of this grain boundary segregation depends mostly on the difference in orientation of grain boundaries. As difference in the orientation angle becomes small, the segregation decreases. The strength of grain boundaries also depends on the orientation difference, even though there is no grain boundary segregation. As atomic conformity in grain boundaries increases, the strength of grain boundaries increases. This fact is much the same for the grain boundary corrosion, and anti-corrosion property is improved with the increase of conformity of grain boundaries.

It is, therefore, important to control the misorientation angle in grain boundaries of materials such as metals or alloys. It would not be exaggeration to say that controlling technology of grain boundaries will create a unique manufacturing process of metals and alloys.

Though single crystalline materials have conventionally been known as materials which solve some defects caused by the grain boundaries, molybdenum single crystalline materials are apt to collapse along a particular crystalline planes, i.e., a (110) face. When defects, even in a slight amount, exist in a single crystalline material, the defects becomes notches to cause the single crystalline material to be ruptured along the particular crystalline plane. This phenomenon is much the same for any other single crystalline material and therefore these single crystalline metals and alloys lack reliability. It is no easy matter to apply single crystalline materials to structural or functional materials.

In other words, single crystalline metals and alloys have anisotropy in performance These single crystalline materials are, on the other hand, excellent in properties, i.e., no grain boundary segregation and conformity of grain boundaries. The application of single crystalline materials to practical fields is thought to be rather desirable.

This invention has been made under those advantages of single crystalline materials as well as under the fact that they have anisotropy in performance, and has an object to provide single crystalline materials which increase reliability in practical use and permit wide range of applications.

This and other object of the invention will become more apparent in the detailed description and examples.

DETAILED DESCRIPTION OF THE INVENTION

This invention provides a laminated material comprising more than three single crystalline layers of a metal or alloy, said layers being joined with one another by diffusion under effects of pressurization and heating in a deoxidative atmosphere and being conformed within an angular range where crystalline orientations of composition planes of the layers can be directly joined.

This invention also provides a laminated material wherein the angular range is defined by difference in crystalline orientation between composition planes, and said difference is estimated within 10 degrees by a sum of twisted and inclined angles.

Substantial characteristics of the laminated material lie in the structures that:

1) The laminated material consists of layers of single crystalline metals or alloys.
2) The laminated material also consists of more than three layers.
3) The layers are joined with one another by diffusion under the effects of pressurization and heating in a deoxidative atmosphere.
4) The layers are also conformed within an angular range where crystalline orientations of composition planes of the layers can be directly joined.

The good performances of single crystalline metallic or alloy materials are made the most of by these characteristics from under the consideration of anisotropy in performance of single crystalline materials.

The laminated materials in Which single crystalline layers are joined with one another can settle the problems resulted from grain boundaries and show sufficient performances of single crystalline materials.

Any metal or alloy, for example, molybdenum, can be adopted to the single crystalline layer. The angular range can be adjusted corresponding to a metal or alloy applied. Further, a shape of the laminated material is not restricted to a particular one. Any shape can be adopted.

The diffusion joining is conducted under a prescribed pressure and temperature in a deoxidative atmosphere such as vacuum or an inert gas atmosphere, i.e., Ar, He or $N_2$.

The number of layers is more than three. This is because a laminated material consisting of two layers of a single crystalline metal or alloy does not show sufficient effects against anisotropy in performance and because such a two-layered material is not necessarily advantageous to produce a large material easily.

The diffusion joining under pressurization and heating can be conducted for every one layer or a layered assembly.

The angular range can be estimated by a sum of twisted and inclined angles between composition planes.

Figure 1:
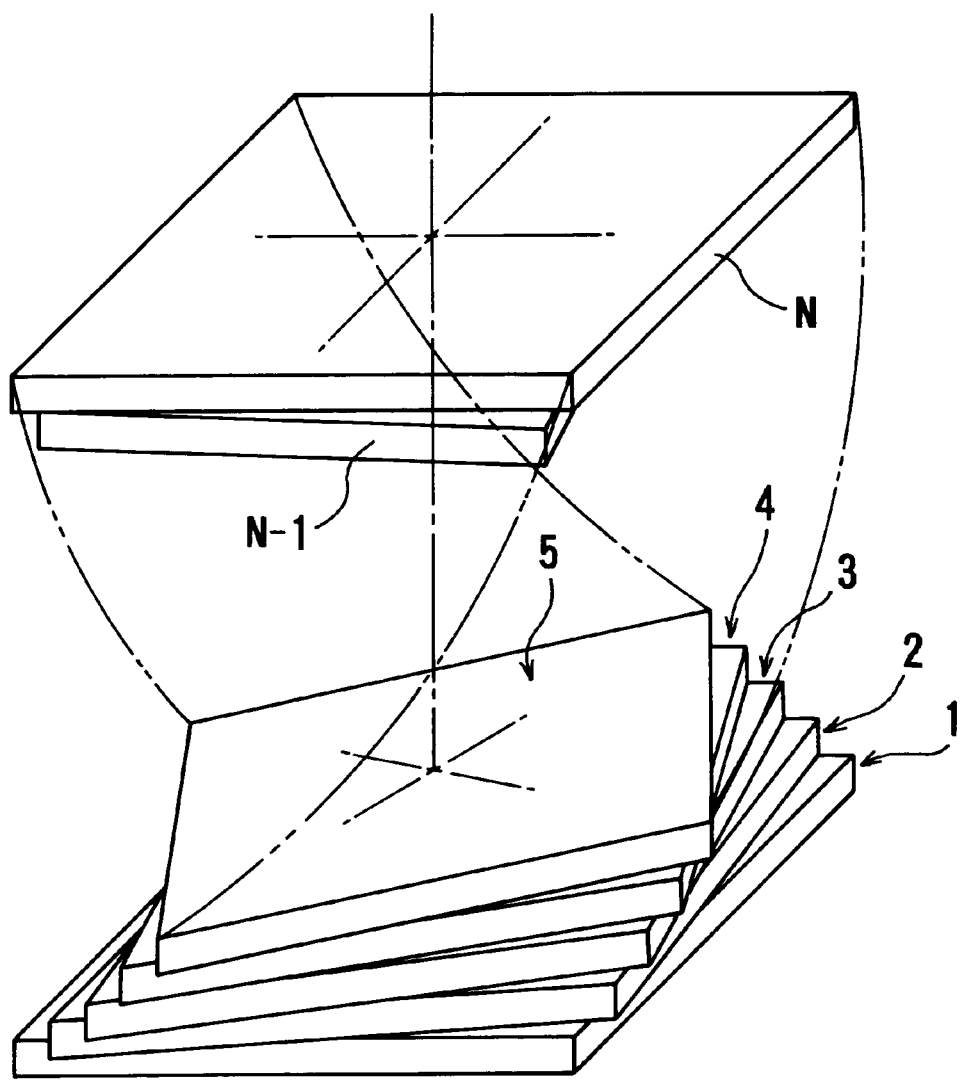
FIG. 1 is a schematic view depicting a lamination manner for a laminated material.

A heat-resistant Ni-base single crystalline alloy shows so excellent a mechanical performance along the (100) face that the (100) face can be selected for the crystalline orientation of the first single crystalline layer as shown in FIG. 1. The second to N-th layers are laminated with the difference in crystalline orientation between laminated planes. The difference can be estimated about 7 degrees by the sum of twisted and inclined angles, with which layers can be joined with good conformity. A laminated material consisting of the Ni-base single crystalline alloy is thus produced.

For the single crystalline molybdenum, the difference in crystalline orientation can be estimated within 10 degrees.

Each laminated layer in these materials has suitable crystalline orientation against the direction of stress. The materials are, therefore, improved in mechanical performance.

The laminated material can be formed into any shape such as a plate or a pipe.

Figure 2:
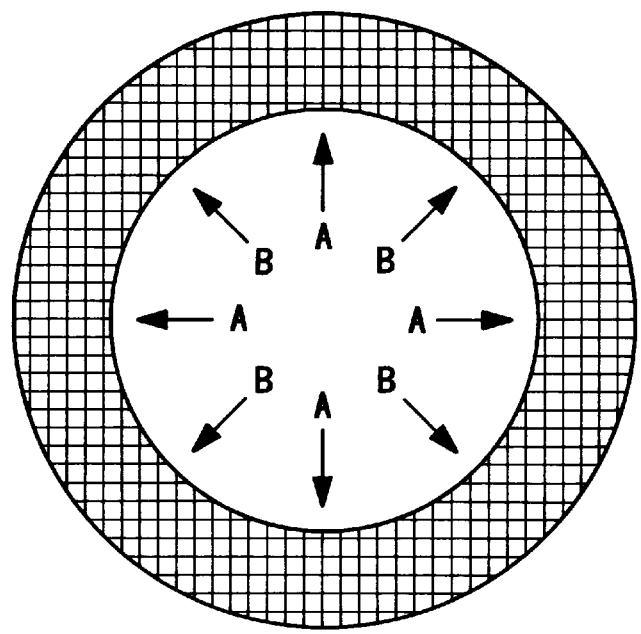
FIG. 2 is a sectional view of a conventional single crystalline material.

A single crystalline pipe is shown in FIG. 2. Grids shown in FIG. 2 represent lattices of a single crystal. The conventional pipe consisting of a single crystal shows good strength at the portions along arrow lines A, but it is, on the other hand, weak at the portions along arrow lines B.

The pipe is apt to collapse at the latter portions.

Figures 3A, 3B:
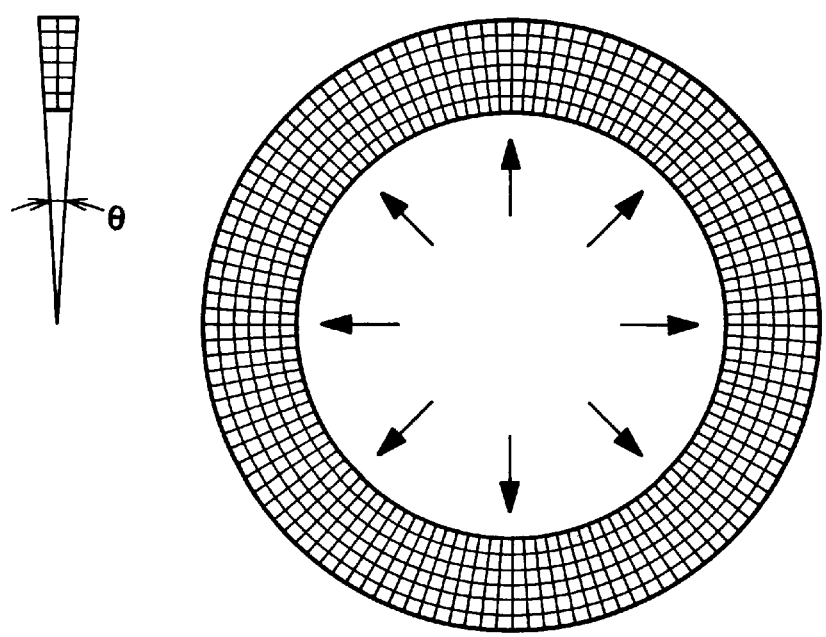
FIG. 3 is a sectional view depicting a pipe made of a laminated material.

Fragments, as shown in FIG. 3a, are cut out from this single crystalline pipe and are laminated in such a manner as shown in FIG. 3b. When the cutting angle &H is within 7 degrees, e.g., 6 degrees, for a Ni-base single crystalline alloy, these fragments can be joined by diffusion and reformed into a pipe. The produced pipe is improved in the mechanical performance and its strength is equal in every direction of internal pressures.

Single crystalline layers are joined with great bonding strength and therefore the laminated material shows a larger resistance against rupture induced by impulse. Since the laminated material is a substantially single crystalline one, several problems caused by grain boundaries are eliminated. Furthermore, the problem in reliability is also eliminated by the laminated structure consisting of more than three layers. The laminated material does not collapse along some particular crystalline plane as is often seen in the conventional single crystalline metallic or alloy materials. Unique structural or functional materials will be produced by the laminated material. It is hoped that single crystalline metals or alloys will be applied to various fields.

Some examples will now be described.

EXAMPLES

Figure 4:
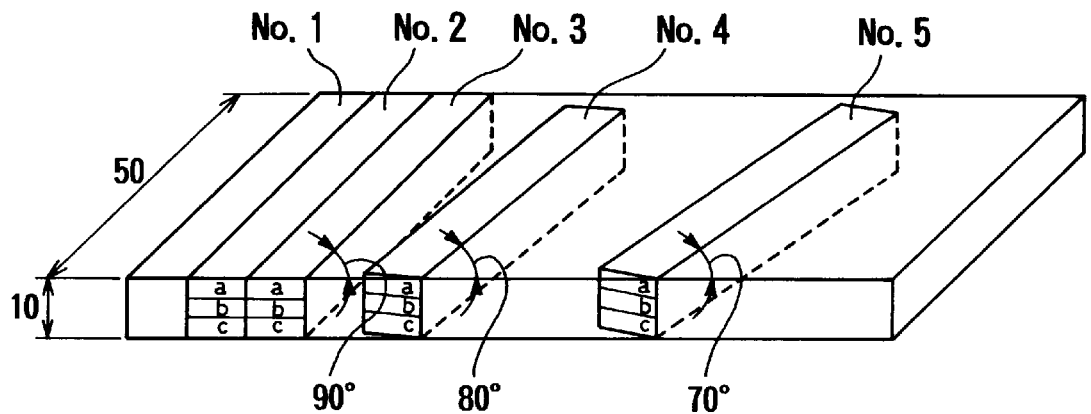
FIG. 4 is a schematic view depicting a cutting manner of specimens from a single crystalline material.
Figure 5:
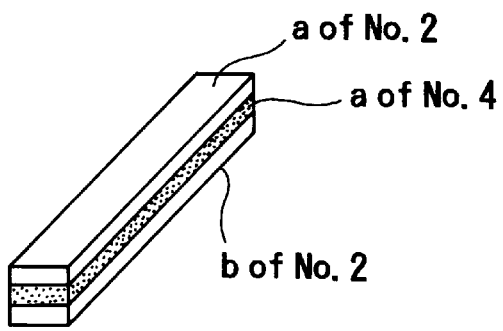
FIG. 5 is a schematic view depicting a lamination manner of an example.

As shown in FIG. 4, specimens (No. 1 to No. 5) the size of which were 10×10 mm were cut out from a molybdenum single crystalline plate (width: 50 mm, thickness: 10 mm), which is produced by secondary recrystallization. The Nos. 2–5 specimens were divided into three fragments (a, b and c) along their thickness, which were of the same size. An a and b of the No. 2 specimen and an a of the No. 4 specimen were laminated in such a manner as described in FIG. 5.

Their composition planes were polished with emery papers and subjected to a chemical polishing before the lamination. These Nos. 2 and 4 specimens were cut out so that twisted angles for crystalline orientation should be 10 degrees between composition planes with inclined angle of 0 degree. The laminated material was subsequently joined by diffusion at 1800 !n and 5 MPa for 30 minutes in vacuum. When the joined material was secured at one end thereof and an iron globe with the weight of 1 kg fell on the other end of the material from the height of 1 m, the material was not ruptured. The result is also described in Table 1. The No. 1 specimen which was not joined was used for a sample referred to referential example 1 in Tablet 1. This sample was ruptured by the same iron globe.

Figure 6:
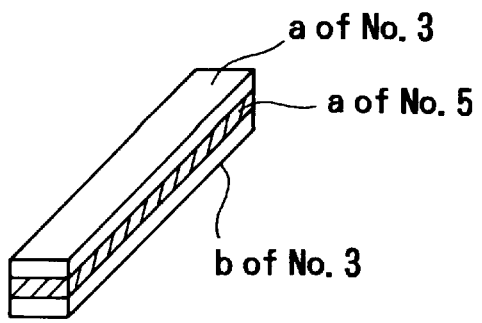
FIG. 6 is a schematic view depicting a lamination manner of a referential example.

An a and b of the No. 3 specimen and an a of the No. 5 specimen were laminated and subjected to diffusion joining. This sample is referred to referential example 2 in Table 1 and shown in FIG. 6. These Nos. 3 and 5 specimens were cut out so that twisted angles should be 20 degrees. The sample was not joined.

TABLE 1

| Test | Temp. (!n) | Press. (MPa) | Time (min) | Twisted angle (degree) | Inclined angle (degree) | Result |
|---|---|---|---|---|---|---|
| Exam. 1 | 1800 | 5 | 30 | 10 | 0 | Not Ruptured |
| Ref. 1 | | | | | | Ruptured |
| Ref. 2 | 1800 | 5 | 30 | 20 | 0 | Not joined |

What is claimed is:

1. A laminated material comprising more than three single crystalline layers of metal, adjacent layers having a difference in crystalline orientation and being joined with one another by diffusion under elevated pressure and temperature in a deoxidative atmosphere and being conformed within an angular range where crystalline orientations of composition planes of the layers can be directly joined, whereby said material exhibits substantially reduced anisotropy as a result of said difference in crystalline orientation.

2. The laminated material according to claim 1 wherein said single crystalline layers are fragments cut from a single crystal material.

3. The laminated material according to claim 2 wherein said single crystal material is in the form of a plate or pipe.

* * * * *